(12) United States Patent
Ruth et al.

(10) Patent No.: US 8,765,607 B2
(45) Date of Patent: Jul. 1, 2014

(54) ACTIVE TILING PLACEMENT FOR IMPROVED LATCH-UP IMMUNITY

(75) Inventors: Robert S. Ruth, Austin, TX (US); Mark A. Kearney, Austin, TX (US); Bernard J. Pappert, Austin, TX (US); Juxiang Ren, Austin, TX (US); Jeff L. Warner, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/150,924

(22) Filed: Jun. 1, 2011

(65) Prior Publication Data

US 2012/0306045 A1    Dec. 6, 2012

(51) Int. Cl.
*H01L 21/311* (2006.01)

(52) U.S. Cl.
USPC .......................................... 438/697; 438/424

(58) Field of Classification Search
USPC .................................. 438/424, 697
See application file for complete search history.

(56) References Cited

U.S. PATENT DOCUMENTS

| 4,247,826 A * | 1/1981 | Gappa et al. .................. 330/264 |
| 5,635,744 A | 6/1997 | Hidaka |
| 5,877,066 A | 3/1999 | Stolmeijer et al. |
| 6,166,415 A | 12/2000 | Sakemi |
| 6,307,263 B1 | 10/2001 | Savignac et al. |
| 6,351,019 B1 * | 2/2002 | DeBrosse et al. ............. 257/510 |
| 6,611,045 B2 | 8/2003 | Travis et al. |
| 6,905,967 B1 | 6/2005 | Tian et al. |
| 2004/0026743 A1 * | 2/2004 | Shibata et al. ................ 257/368 |
| 2005/0133864 A1 | 6/2005 | Iwamatsu |
| 2007/0170518 A1 | 7/2007 | Furukawa |
| 2007/0221957 A1 | 9/2007 | Kitajima |
| 2009/0256180 A1 | 10/2009 | Azuma |
| 2010/0109090 A1 | 5/2010 | Zitouni et al. |

FOREIGN PATENT DOCUMENTS

| EP | 0977262 A2 | 7/1999 |
| JP | 2011109130 A | 6/2011 |
| WO | WO 01/01468 A1 | 1/2001 |

OTHER PUBLICATIONS

Extended European Search Report for Application No. 12169865.8, dated Jul. 19, 2013.

* cited by examiner

*Primary Examiner* — Allen Parker
(74) *Attorney, Agent, or Firm* — Terrile, Cannatti, Chambers & Holland, LLP; Michael Rocco Cannatti (57) ABSTRACT

A semiconductor device includes CMP dummy tiles (36) that are converted to active tiles by forming well regions (42) at a top surface of the dummy tiles, forming silicide (52) on top of the well regions, and forming a metal interconnect structure (72, 82) in contact with the silicided well tie regions for electrically connecting the dummy tiles to a predetermined supply voltage to provide latch-up protection.

14 Claims, 5 Drawing Sheets

ACTIVE TILING PLACEMENT FOR IMPROVED LATCH-UP IMMUNITY

BACKGROUND OF THE INVENTION

1. Field of the Invention

The present invention is directed in general to the field of semiconductor devices. In one aspect, the present invention relates to the use of tiling features to improve latch-up immunity of an integrated circuit.

2. Description of the Related Art

Latch-up is the condition where parasitic devices inherent in many CMOS structures cause the CMOS structure to enter an electrical state unrelated to its normal operation. This is often manifested as an abnormal high current conduction state which may be transient, may disappear when the triggering stimulus is removed, or may be permanent in the sense that the structure becomes frozen in that state as long as power continues to be applied. Unless the current in the latch-up state is somehow limited, it can also be destructive. Unfortunately, the problem of latch-up increases as CMOS device and circuit dimensions are scaled down, requiring a chip designer to make design tradeoffs to optimize the structure in order to avoid latch-up, typically by increasing the device and/or circuit area.

Accordingly, there is a need for improved CMOS structures and methods to provide improved latch-up immunity which overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for manufacturing a semiconductor device having improved latch-up immunity by filling unused space between cells and intellectual property (IP) core areas with active tile structures that are tied to a reference supply or ground voltage to provide latch up protection between the cells/IP. In addition, dummy tiles used to promote uniform chemical mechanical polishing (CMP) can be converted to well ties of different polarities which are electrically connected and routed to the appropriate supply voltage, thereby forming active tile structures. As disclosed, the conversion of dummy tiles to electrically active ones for reducing latch-up risk may be implemented by covering the selected dummy tile regions with the appropriate implant layers and constructing one or more conductive routing layers to connect the converted tiles an appropriate ground or power supply voltage. In selected embodiments, a dummy tile placement algorithm is modified or reused to place additional active tiles in empty spaces between circuit areas so as to promote both CMP planarity and latch up immunity. For example, dummy active tiles may be placed or located in all non-active circuit areas. Alternatively, dummy tiles may be placed or located in an initial design pass in accordance with a CMP polish placement algorithm, and then the tile density may be increased in a defined area (and possibly decreased in other areas) by surveying the defined area to determine whether its tile density meets a required threshold, and if not, additional active tiles are inserted in the layout design using an iterative process of inserting smaller and smaller active tiles until the required density threshold is met. In yet other embodiments, a CMP tile placement algorithm may be modified to address both CMP concerns and to increase latch-up immunity by adding tiles in an intelligent manner based on knowledge of risk of neighboring IP blocks. As will be appreciated, the tile density may be increased by inserting any desired shape of active tiles. To provide latch-up protection, the additional active tiles are formed in a predetermined well region (e.g., PWELL/NWELL) and implanted with predetermined impurities (e.g., N+/P+ implants) to form contact regions that are connected to a predetermined supply voltage (e.g., VDD/GROUND). In an example automated design sequence, the design of the functional circuitry in the SoC integration is completed with all blocks properly connected, and then tiles are placed or located between all functional circuit areas so as to promote CMP polishing uniformity. The tiles which will improve latch-up immunity are then identified and converted to electrically active tiles by adding the appropriate implant/diffusion regions (N+/P+ and possibly NW or PW) and the appropriate pins. Lastly, the design is returned through the SoC integration flow to connect the active tiles to the appropriate supply voltage. With this approach, latch-up protection is added at the SoC level as opposed to the cell/IP level by reusing active structures that are placed for CMP planarity purposes.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials (such as metal tiling layers) will be formed and removed to fabricate the semiconductor structure. Where the specific procedures for forming or removing such materials are not detailed below, conventional techniques to one skilled in the art for growing, depositing, masking, etching, removing or otherwise forming such layers at appropriate thicknesses and dimensions may be used. Such details are well known and not considered necessary to teach one skilled in the art of how to make or use the present invention.

As indicated above, latch-up is a problem with many CMOS structures, especially as device and circuit dimensions shrink. Another challenge in this area is that the internal blocks in System on Chip (SoC) designs are not typically subject to the area-intensive design rules required of IO circuitry to address latch up, instead opting to prioritize density increases over addressing latch up risk. Conventionally, the risk that internal IP blocks on an SoC will be subject to noise/charge injection due to non-ideal electrical environments (e.g., at power-up events, simultaneous switching events, etc.) is addressed at the IP/cell level by including protection within the IP/cells, but no additional protection is added at the SoC integration level to address interaction between IP blocks.

Figure 1:
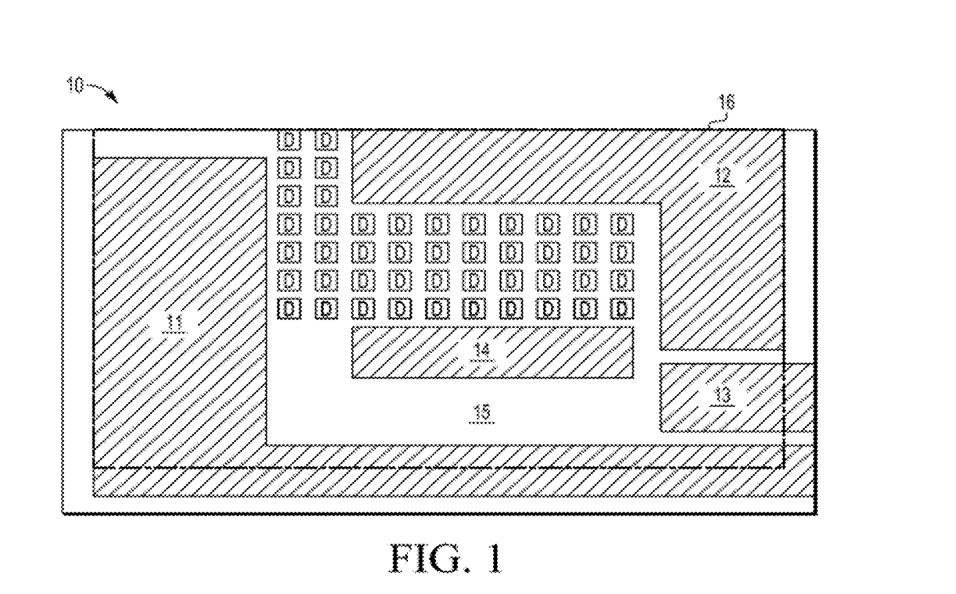
FIG. 1 illustrates a top plan view of part of an internal chip area where dummy tiles are placed to improve uniformity of chemical mechanical polishing in accordance with a tile placement algorithm which leaves empty spaces between circuit areas.

Reference is now made to FIG. 1 which illustrates a top plan view of part of an internal chip area 10 where dummy tiles (D) are placed between active circuit areas 11-14 to improve uniformity of chemical mechanical polishing in accordance with a tile placement algorithm which leaves empty spaces 15 between circuit areas 11, 14, 15. As shown, the dummy tiles (D) have been placed or located in a defined window region 16 to solve the problems related to dishing and other accumulated thickness effects. The dummy tile process typically processes a defined window region 16 by creating or identifying circuit layout area(s) (e.g., 11-14), defining a buffer zone (typically in a range of approximately 1-10 microns) around active features within the circuit layout, combining the circuit layout with the buffer zone to define excluded areas, and then adding dummy tiles (D) to the excluded areas until a predetermined percentage of the excluded areas in the defined window region 16 is covered with dummy tiles. As a result, the typical dummy tile placement process leaves empty spaces (e.g., 15) between cells/IP 11-14 that could be used for additional latch up protection.

While dummy tiles are drawn as "active" or OD layers during CAD design, this same layer may be used to define the electrically active tile layers described herein. Thus, in selected embodiments, the terms "tile" or "tiles" refer to the CAD process of drawing polygons of silicon which in the manufacturing process aids in CMP planarity, where "dummy tiles" refer to the tiles that are used for CMP planarity benefits without providing circuit functionality and "electrically active tiles" refer to tiles that are biased at a predetermined voltage.

One of the challenges for designing an internal chip area 10 such as shown in FIG. 1 is that the internal functional circuit blocks 11-14 have not been subjected to area-intensive design rules to address latch up. In these internal circuit areas, circuit density is given higher priority over addressing latch up risk, but there can still be latch-up risk between internal circuit blocks from noise/charge injection due to non-ideal electrical environments (power-up events, simultaneously switching events, etc.). For example, an internal circuit area (e.g., "I/O Connection" circuit 14) can inject majority carriers (holes) into the substrate in the empty area 15, thereby increasing the local voltage in the substrate potential for surrounding circuit areas 11-13 (e.g., Standard Cells) which can result in latch-up.

Figure 2A:
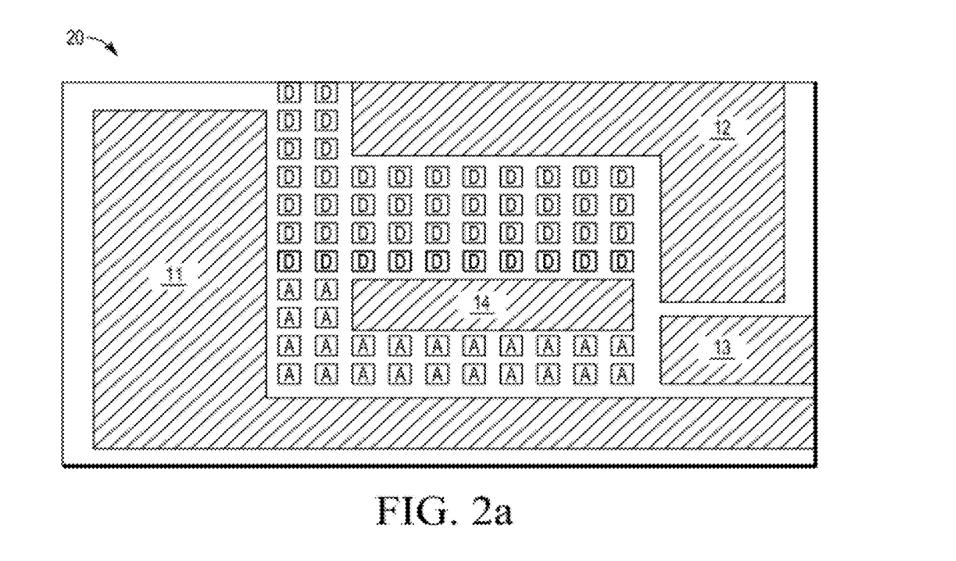
FIGS. 2a-c illustrate example embodiments with top plan views of part of an internal chip area where active tiles are placed in the empty spaces between circuit areas and tied together to improve latch-up immunity.

In accordance with selected embodiments of the present invention, improved latch-up immunity is provided by placing additional active tiles in internal chip areas which function to tie the substrate to a power or ground supply voltage. In an example shown in FIG. 2a, there is illustrated a first top plan view of part of an internal chip area 20 where additional active tiles (A) are placed in the empty spaces between circuit areas 11, 13, 14 and tied together to improve latch-up immunity. As depicted, the same features used for dummy tiling structures may be used as active tiling features that are designed as part of the SoC chip-finishing flow for advanced CMOS processing. However, instead of being connected only to the substrate, the active tiles are also connected through the metal interconnect structure to well ties and supply voltage of appropriate polarities, depending on the polarity of nearby emitters. In addition, the layout and routing design of the active tiles uses information about nearby circuit blocks to prioritize the conversion and routing of dummy (or CMP) tiles to active tiles on the latch-up protection needs of the surrounding circuit blocks. With a minimum of additional processing steps, the dummy tiling structures can be converted at some point in the design flow to substrate and/or well ties and then subsequently connected to the appropriate power grid at a later stage in the design flow. As will be appreciated, the converted dummy tiling structures can be randomly chosen or specifically selected to be proximate to circuit areas where latch-up is likely to occur (e.g., I/O connection circuit areas). In addition, the conversion processing and placement algorithm may be controlled on the basis of the polarity type for the nearby emitter so that active tiles with N+ regions in N-wells are formed near n-type emitter circuits, while P+ regions in P-wells are formed near p-type emitter circuits.

The addition of electrically active tiles not only improves latch-up immunity, but may also improve component performance for the charged device model (CDM) electrostatic discharge (ESD) events and reduce the voltage drop across the power distribution network (commonly referred to as the IR-drop). The additional substrate ties may also improve the electromagnetic compatibility (EMC) of the device by enabling the device to function without introducing intolerable electromagnetic disturbances to the environment.

Figure 2B:
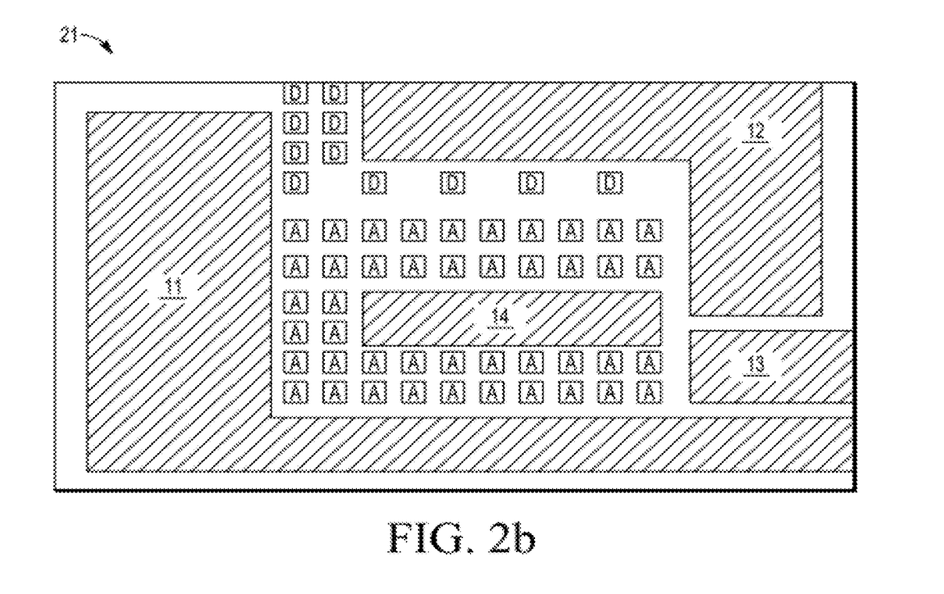

In accordance with selected embodiments of the present invention, improved latch-up immunity may also be provided by replacing dummy tiles (D) with additional active tiles (A) in internal chip areas which function to tie the substrate to a power or ground supply voltage. In an example shown in FIG.

2b, there is illustrated a second top plan view of part of an internal chip area 21 where the design flow has identified and removed selected dummy tiles (D) from regions between circuit areas 11, 13, 14 that would not be beneficial (either for latch-up or CMP uniformity), and added additional and/or replacement active tiles (A) that are tied together to improve latch-up immunity. As illustrated in FIG. 2b, the total number of dummy (D) and active (A) tiles in the proposed placement 21 meets or exceeds the minimum number of tiles (46) required for the CMP uniformity (as shown in FIG. 1), but the number and type of tiles have been rearranged and converted to benefit latch up. Thus, while the number of dummy tiles (D) is reduced, the total number of dummy (D) and active (A) tiles being at least 46 in both cases implies that the CMP density requirement is always met.

Figure 2C:
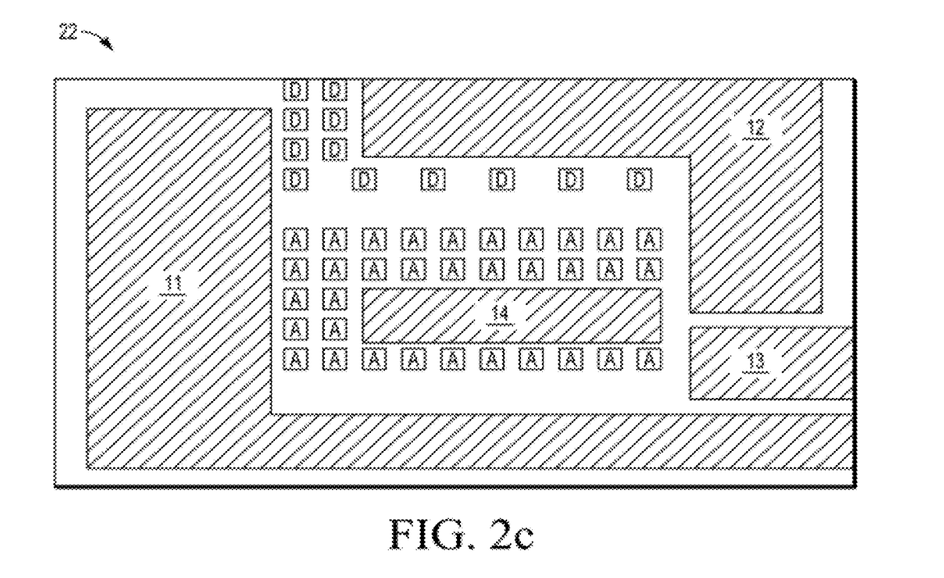

In yet other embodiments, improved latch-up immunity may also be provided by replacing dummy tiles (D) in internal chip areas with active tiles (A) so as to maintain the total number of tiles in a given chip area. In an example shown in FIG. 2c, there is illustrated a third top plan view of part of an internal chip area 21 where the design flow has identified selected dummy tiles (D) from regions between circuit areas 11, 13, 14 that would not be beneficial (either for latch-up or CMP uniformity), and has replaced these tiles with an equal number of replacement active tiles (A) that are tied together to improve latch-up immunity. In FIG. 2c, the total number of dummy (D) and active (A) tiles in the proposed placement 22 equals the number of tiles (46) required for the CMP uniformity (as shown in FIG. 1), but the type of tiles have been rearranged and converted to benefit latch up. Thus, while the number of dummy tiles (D) is reduced, the total number of dummy (D) and active (A) tiles meets the threshold number of tiles (e.g., 46) required to satisfy the CMP density requirement.

Figure 3:
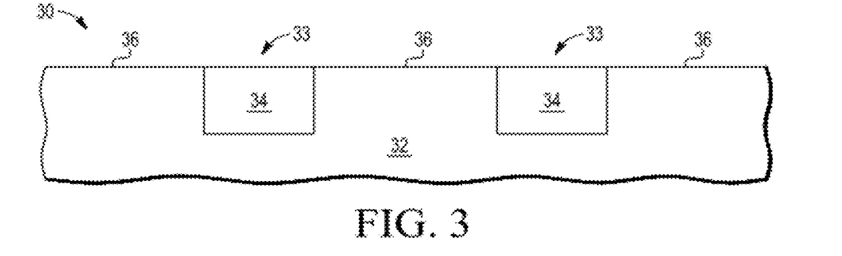
FIG. 3 illustrates in cross-sectional form a portion of a semiconductor substrate in which isolation regions are formed between active tile regions which assist with polishing uniformity of the isolation regions.

To illustrate an example processing sequence for fabricating active tiles, reference is now made to FIG. 3 which shows in cross-sectional form a portion of a semiconductor wafer structure 30 in which isolation regions 34 (e.g., shallow trench isolation regions) are formed in a semiconductor substrate 32 to define tile regions 36 which assist with polishing uniformity of the shallow trench isolation regions 34. Specifically, the semiconductor substrate layer 32 may be formed of a semiconductor material having a predetermined crystallographic orientation, and may be implemented as a bulk silicon substrate, single crystalline silicon (doped or undoped), SOI substrate (although latchup is not a threat on SOI substrates), or any semiconductor material including, for example, Si, SiC, SiGe, SiGeC, Ge, GaAs, InAs, InP as well as other Group III-V compound semiconductors or any combination thereof. As will be appreciated, the semiconductor substrate layer 32 may be appropriately doped to provide n-type (electron) and p-type (hole) carriers.

To form the shallow trench isolation regions 34, one or more patterned mask layers (not shown) are formed on the substrate 32 to define shallow trench openings 33 using any desired pattern and etch techniques. For example, a patterned layer of photoresist may be formed over masking layers of oxide and/or nitride to define and remove the exposed mask layer(s) from the substrate 32. After stripping the photoresist (e.g., with an ash/piranha process), shallow trench openings 33 are formed in the semiconductor substrate 32 using any desired anisotropic etch technique, including a dry etching process such as reactive-ion etching, ion beam etching, plasma etching or laser etching, a wet etching process wherein a chemical etchant is employed or any combination thereof. After forming the shallow trench openings 33, planarized shallow trench isolation regions 34 are formed by filling the trench openings 33 with a polished insulator material, such as by depositing a dielectric material (such as high density plasma oxide), and then polishing, etching or otherwise planarizing the deposited dielectric to form the shallow trench isolation region 34, alone or in combination with additional etching, stripping and/or cleaning processes. In the course of polishing the shallow trench isolation region 34, the defined tile regions 36 serve as CMP tiles to promote planar polishing by reducing dishing. While selected embodiments are described herein with reference to example shallow trench isolation region areas, it will be appreciated that selected embodiments may be practiced with other isolation features or trench isolation regions, such as deep trench isolation regions.

Figure 4:
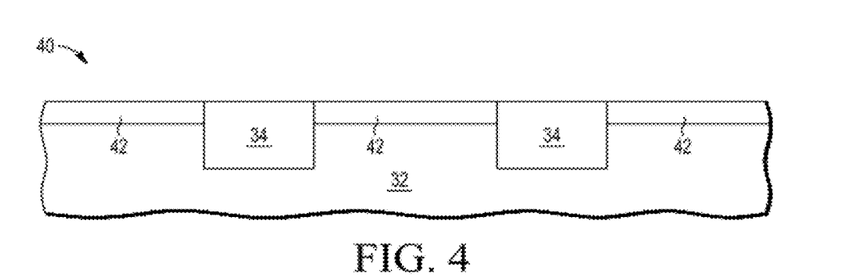
FIG. 4 illustrates processing subsequent to FIG. 3 after well regions are formed at the active tile region areas between the isolation regions.

FIG. 4 illustrates processing of the semiconductor wafer structure 40 subsequent to FIG. 3 after well regions 42 are formed at the active tile region areas between the shallow trench isolation regions 34. While the well regions 42 may be formed with any desired diffusion or implantation process, in selected embodiments, an implant mask (not shown) may be used to selectively diffuse or implant materials having a predetermined conductivity type (e.g., n-type or p-type) which matches the conductivity type of the substrate 32. For example, the well regions 42 may be formed by implanting n-type impurities into the n-type semiconductor substrate 32 at a predetermined implant energy and dopant concentration (e.g., at least approximately $1E19$ atoms/cm$^3$) so as to form an N+ well region 42 located in an upper portion of the semiconductor substrate 32. Alternatively, the well regions 42 may be formed by implanting p-type impurities into the p-type semiconductor substrate 32 at a predetermined implant energy and dopant concentration to form a P+ well region 42.

Figure 5:
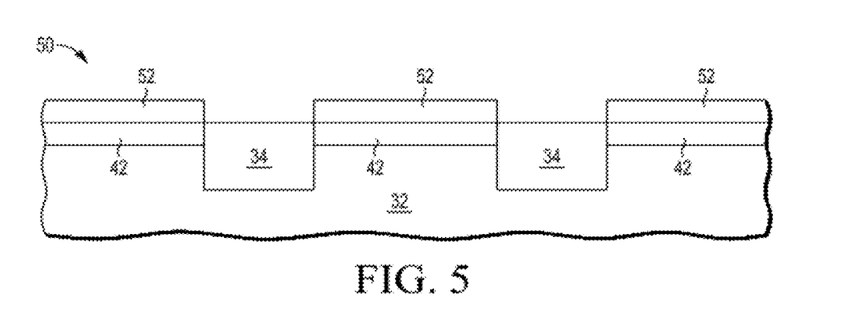
FIG. 5 illustrates processing subsequent to FIG. 4 after silicide regions are formed over the well regions.

FIG. 5 illustrates processing of the semiconductor wafer structure 50 subsequent to FIG. 4 after silicide regions 52 are formed over the well regions 42. As formed, the silicide layers 52 facilitate electrical connection between the active tiles and the appropriate supply voltage by reducing resistance of the active tiles. While any desired silicide formation process may be used to form the silicide layer 52 (such as $CoSi_2$ or NiSi) on the well regions 42, an example silicide formation sequence would be to deposit or sputter a conductive or metal layer (e.g., cobalt or nickel) over the semiconductor wafer structure, followed by a heating step to react the metal layer with the well regions 42 to form silicided layers 52. In an illustrative embodiment, the reaction of the metal layer and the well regions 42 is promoted by performing an initial rapid thermal anneal step (e.g., 400-600° C.), followed by a Piranha clean step to remove excess metal, and then followed by a second rapid thermal anneal step (e.g., 650-850° C.). The timing and temperature of the initial rapid thermal anneal step are selected so that the metal layer reacts with the exposed surfaces of the well regions 42 in the semiconductor layer 32. After the Piranha clean step, the timing and temperature of the second rapid thermal anneal step are selected so that the reacted silicide 52 is pushed into a low resistivity phase.

Figure 6:
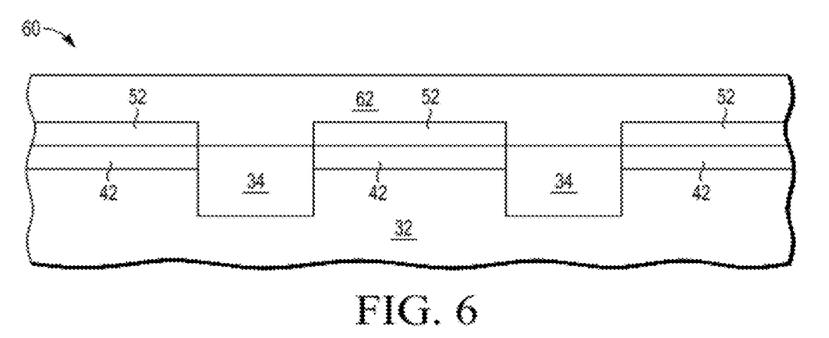
FIG. 6 illustrates processing subsequent to FIG. 5 after an insulation layer is formed over the substrate.
Figure 7:
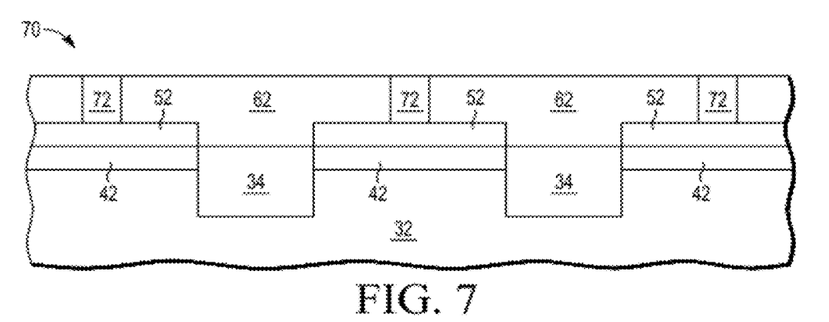
FIG. 7 illustrates processing subsequent to FIG. 6 after metal contacts to the silicide regions are formed in the insulation layer.
Figure 8:
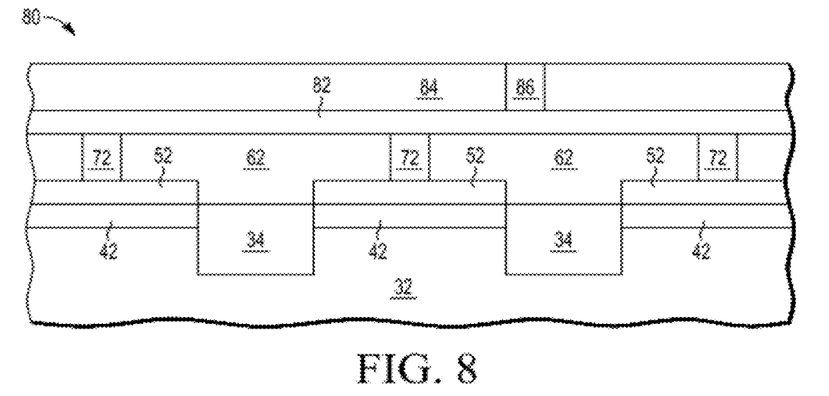
FIG. 8 illustrates processing subsequent to FIG. 7 after a conductor layer is formed over the substrate to connect the metal contacts to any appropriate supply voltage.

FIGS. 6-8 illustrate processing to provide electrical connection and routing of the active tiles to the appropriate supply voltage. Starting with FIG. 6, there is illustrated processing of the semiconductor wafer structure 60 after an insulation layer 62 is formed with one or more inter layer dielectric (ILD) layers. As shown, the insulation layer 62 may be formed by depositing and planarizing a low dielectric constant k material to form an insulating layer over the active circuits and tiles formed on in the substrate. In the ILD layer(s) 62, conductive contact structures or vias 72 are formed as illustrated in FIG. 7 which illustrates processing of the semiconductor wafer structure 70 subsequent to FIG. 6 after metal contacts 72 to the silicide regions 52 are formed in the insulation layer(s) 62. While any desired contact formation process may be used, an example contact formation sequence would be to pattern the insulating layer 62 with one or more contact mask layers (not shown) to define contact or via openings where the contacts 72 are to be located, and then deposit a conductive or metal layer to fill the contact/via openings so that a planarization process (e.g., CMP) removes the conductive/metal layer to the level of the top of the insulating layer 62, thereby forming the conductive contact structures or vias 72. After removing the contact mask layers, the contacts 72 may be routed to the appropriate supply voltage terminal 86 by forming one or more supply voltage conductor or routing layers 82, as shown in FIG. 8 which illustrates processing of the semiconductor wafer structure 80 subsequent to FIG. 7 after a supply voltage conductor layer 82 is formed over the substrate to connect the metal contacts 72. Though shown as a single metal layer 82, it will be appreciated, that the supply voltage conductor layer 82 may be formed by depositing or sputtering a conductive or metal layer over the semiconductor wafer structure, followed by a patterned etch process to define routing conductor lines for connecting the contacts 72 and underlying active tiles to the appropriate supply voltage, such as a ground supply (if the substrate is p-type) or a power voltage supply (if the substrate is n-type). On the supply voltage conductor layer 82, a dielectric layer 84 is then deposited and patterned to define a contact opening in which the conductive power supply terminal 86 is formed.

It will be appreciated that additional processing steps will be used to fabricate the active tiling structures described herein, such as preparation and formation of one or more sacrificial oxide layers, deposition of one or more nitride layers, a nitride strip process, formation of liners layers in the shallow trench isolation regions, formation of various buried well or regions. In addition, other circuit features may be formed on the wafer structure, such as transistor devices which are formed with additional processing steps, including but not limited to one or more sacrificial oxide formation, stripping, isolation region formation, well region formation, gate dielectric and electrode formation, extension implant, halo implant, spacer formation, source/drain implant, heat drive or anneal steps, and polishing steps, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Figure 9:
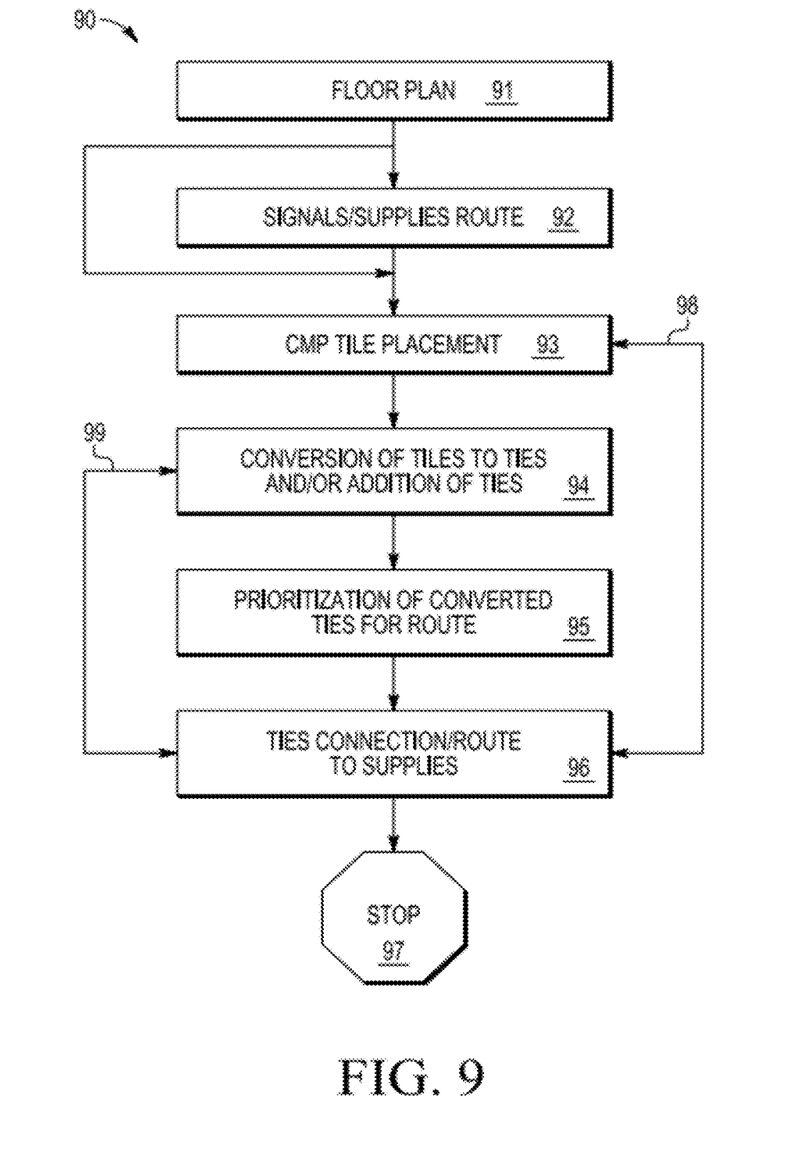
FIG. 9 illustrates in flow chart form an exemplary design methodology for placing active tiles in predefined areas on a die and tying or connecting the active tiles to a reference supply voltage.

In accordance with various embodiments of the present invention, a design and fabrication methodology is provided to improve latch-up immunity by forming active tiling structures in internal or localized chip areas that are connected to a supply voltage depending on the polarity of nearby emitters. The design and placement of active tiling structures may use risk analysis to selectively prioritize the placement or conversion of CMP tiles based on circuit design considerations for nearby circuit blocks. FIG. 9 illustrates in flow chart form an exemplary design methodology 90 for placing active tiles in predefined areas on a die and tying or connecting the active tiles to a reference supply voltage. Though selected embodiments of the methodology are illustrated in FIG. 9, it will be appreciated that the sequence of illustrated steps may be modified, reduced or augmented in keeping with the disclosure of the present invention. For example, one or more of the steps may optionally be included or excluded. Thus, it will be appreciated that the methodology of the present invention may be thought of as performing the identified sequence of steps in the order depicted in FIG. 9, though the steps may also be performed in parallel, in a different order, or as independent operations that are combined.

As depicted, the methodology begins at step 91, where the circuit design floor plan for the system is developed or received. Generally speaking, a floor plan of an integrated circuit is a simplified physical representation of tentative placement of the major functional circuit blocks. In modern electronic design process, floor plans are created during the floor planning design stage, an early stage in the hierarchical approach to chip design.

At step 92, the signal and supply routing is designed to establish the metal interconnect paths for providing signals and supply voltages (e.g., ground and power) to the functional circuit blocks. The routing step 92 is shown as being separate from the floor plan design step 91, but this is not necessarily the case. Alternatively, the routing step 92 may not occur at this stage of the design process, but may instead occur later at step 96 (described below).

At step 93, the CMP tiles are placed or located on the chip. As will be appreciated, existing tile placement algorithms can be used to identify locations on the SoC where CMP processing is likely to produce dishing and then insert CMP tiles in those locations using a predetermined tile placement scheme. At this point, the tile placement algorithm may be configured to identify unused space on the SoC between cells and IPs and then insert additional tiling features or structures that can converted and used to provide latch up protection between the cells/IP.

In order to provide latch up protection, active tiling features or structures are included in the layout design by adding active tiles and/or converting CMP tiles into active tiles having well tie structures which are connected to the appropriate supply voltage depending on the polarity of nearby emitters. This conversion process may be automated as part of the SoC integration/chip finishing process so that selected CMP tiles are converted to well tie structures and/or additional tiles are added to the SoC design. In selected embodiments, the conversion process adds active tiles to the CMP tile placement (from step 93), although the design flow may also remove CMP tiles from regions where they would not be beneficial (either for latch-up or CMP), provided that additional and/or replacement active tiles are included in the tile placement such that the minimum number of total tiles (CMP and active tiles) meets or exceeds the minimum number of tiles required to meet the CMP density requirements. In FIG. 9, the conversion process is shown as beginning at step 94 after the CMP tiles have been located, but it will be appreciated that the conversion process can begin earlier in the design sequence 90. In the conversion step 94, the fabrication sequence is adjusted to identify the CMP tiles for conversion and add the well tie features to the CMP tiles, such as by implanting the N+/P+ well regions and forming the silicide layers.

At step 95, the converted active tiles with well tie structures are prioritized for purposes of determining how each active tile will be routed. The prioritization decision may use a localized risk analysis to determine the polarity of the active tile based on the polarity of the nearby emitters in the active circuit block areas. In this way, information about nearby circuit blocks may be used to prioritize CMP tile conversion and routing of the converted well ties based on latch-up protection needs. As a result of prioritization, active tiles formed in P wells are prioritized for routing and connection to a ground reference supply voltage, while active tiles formed in N wells are prioritized for routing and connection to a power reference supply voltage. As will be appreciated, the prioritization decision may be performed earlier in the design sequence 90.

At step 96, the metal interconnect structures are designed to establish the metal interconnect paths for connecting the well tie structures in the active tiles to the corresponding reference supply voltages (e.g., ground and power) in accordance with the prioritized design. While the tie connection/routing step 96 is shown as occurring last, it will be appreciated that this step may be performed earlier in the design sequence 90.

As will be appreciated, selected embodiments of the present disclosure may be implemented as an iterative process whereby the placement and/or conversion of CMP dummy tiles to active ties and construction of routing layers uses a "loop back" process in the design flow. For example, after an initial design pass to convert, prioritize and route active ties, the design process may loop back (loop back path 98) to the CMP tile placement process (step 93) where CMP tiles are placed or located on the chip so that steps 94-96 may be repeated to convert, prioritize and route additional active ties. In addition or in the alternative, the design process may loop back (loop back path 99) to the tile conversion process (step 94) so that additional CMP tiles may be converted, prioritized and routed to place more electrically active tiles in the layout design.

In a result of the design sequence 90, latch-up protection is added at the SoC level by re-using CMF tiling structures and/or adding new active tiling structures based on information concerning the latch-profile of surrounding active circuit blocks. In selected embodiments, the active tiling density across the SoC design or predetermined sub-partitions thereof may be increased to a predetermined tiling density threshold. In addition or in the alternative, different tiling density thresholds may be used for different zones or areas of the SoC design. For example, the initial SoC floor plan may be designed to include CMP tiles in accordance with a CMP tile placement algorithm. Then, after the CMP tiles ate inserted in the SoC design, additional active tiles can be placed in empty spaces between circuit blocks or cells and converted to include well ties for improved latch-up protection.

After completion of the SoC layout design to add active tile structures for improving latch-up immunity and otherwise determine the positioning and arrangement of various layers and components of the integrated circuit, the design is then fabricated as a SoC integration/chip on a wafer. In this process, the layout design is verified, and various masks are prepared for the etch, mask, and/or implantation processes. In addition, a sequence of photographic and chemical processing steps are defined for creating the electronic circuits in the SoC design by depositing, removing, and patterning various layers, as well as modifying electrical properties of various layers. Examples of different processing steps which may be used to complete the fabrication of the SoC design include, but are not limited to, one or more semiconductor wafer or substrate formation, dielectric layer formation, substrate etching, chemical mechanical polishing, implantation and/or diffusion, silicide formation, sacrificial oxide formation, stripping, extension implant, halo implant, spacer formation, source/drain implant, source/drain anneal, contact area silicidation, and polishing steps. In addition, backend processing step may be performed to form one or more levels of interconnect to connect the active tiles to a reference voltage source in a desired manner to achieve the desired functionality. It will be appreciated that the specific sequence of steps used to complete the fabrication of the SoC design may vary, depending on the process and/or design requirements.

By now it should be appreciated that there has been provided a method for making a semiconductor device. In the disclosed methodology, a semiconductor substrate of a first conductivity type is provided which includes a plurality of tiles that are spaced apart to promote planar chemical mechanical polishing of one or more shallow trench isolation regions formed in the semiconductor substrate. As disclosed herein, the tiles may be placed to inhibit scooping from chemical mechanical planarization (CMP) and/or may be located between circuit block areas or otherwise located in close proximity to internal circuit areas at risk for latch-up. In selected embodiments, the semiconductor substrate is provided by forming at least one trench opening in the semiconductor substrate which defined by the plurality of tiles formed from the semiconductor substrate, and then depositing and planarizing an insulating material to cover the plurality of tiles and fill the trench opening(s) and form the one or more shallow trench isolation regions. At a top surface of the plurality of tiles, a plurality of well tie regions are formed of the first conductivity type, such as by implanting or diffusing heavily doped p-well regions into p-type tiles that are formed from the semiconductor substrate and have relatively lighter doping, or by implanting or diffusing heavily doped n-well regions into n-type tiles that are formed from the semiconductor substrate and have relatively lighter doping. In addition, a silicide layer may be formed on top of the well tie regions. Subsequently, a metal interconnect structure is formed in conductive or electrical contact with the plurality of well tie regions for electrically connecting the plurality of tiles to a predetermined reference voltage to provide latch-up protection. For example, tiles formed with heavily doped p-well regions are electrically connected to a ground supply voltage, while tiles formed with heavily doped n-well regions are electrically connected to a power supply voltage.

In another form, there is provided a method and system for placing active tiles in an integrated circuit design; In the disclosed embodiments, an initial circuit design floor plan is generated or received which specifies placement of a plurality of functional circuit blocks for the integrated circuit design. In the initial circuit design floor plan, a plurality of dummy tiles are placed in the according to a first tile placement algorithm which may, for example, placed the dummy tiles at locations in the initial circuit design floor plan where chemical mechanical polishing would produce dishing without the presence of the dummy tiles. In addition, a plurality of active tiles is placed in the initial circuit design floor plan according to a second tile placement algorithm to promote latch-up immunity. In selected embodiments where the dummy tiles are placed to leave empty spaces between the functional circuit blocks, the active tiles may be placed in the empty spaces between functional circuit blocks. In other embodiments, the active tiles are placed by converting one or more of the plurality of dummy tiles to active tiles in the initial circuit design floor plan according to the second tile placement algorithm. In addition or in the alternative, the active tiles may be placed by converting one or more of the plurality of dummy tiles to active tiles by taking advantage of the existing fabrication process flow for the integrated circuit design to include a highly doped region and silicide layer in each of the one or more of the plurality of dummy tiles, and then including one or more conductive routing layers for electrically connecting each of the one or more of the plurality of dummy tiles to ground or power supply voltage. The initial circuit design floor plan is also revised to electrically connect the plurality of active tiles to a supply voltage. As revised and finalized, the integrated circuit design is manufactured on a semiconductor wafer to include the plurality of active tiles which are electrically connected to a supply voltage.

In yet another form, there is provided an integrated circuit device and method for fabricating same. In the disclosed embodiments, the integrated circuit device includes a semiconductor substrate in which is formed one or more trench isolation regions. The integrated circuit device also includes a plurality of active tile structures disposed on the semiconductor substrate to prevent dishing from chemical mechanical polishing of the one or more trench isolation regions formed in the semiconductor substrate. As formed, the plurality of active tile structures each include a highly doped region located at least at a top surface, a silicide layer formed on the highly doped region, and one or more conductive routing layers electrically connected to the silicide layer and electrically connected to a predetermined supply voltage terminal, such as a ground or power supply voltage terminal. In selected embodiments, the semiconductor substrate is a p-type substrate or well, and the highly doped region is a P+ region which is electrically connected through the silicide layer and the one or more conductive routing layers to a ground supply voltage. In other embodiments, the semiconductor substrate is an n-type substrate or well, and the highly doped region is an N+ region which is electrically connected through the silicide layer and the one or more conductive routing layers to a power supply voltage. In addition, the conductive routing layers in the integrated circuit device may be formed as a conductive contact structure or via formed in a dielectric layer to contact the silicide layer, and a supply voltage conductor layer formed over the dielectric layer to contact the conductive contact structure or via. As formed, the semiconductor substrate may include one or more active circuit regions, where the active tile structures are located outside of the active circuit regions. In addition, the integrated circuit device may include dummy tile structures disposed on the semiconductor substrate and located to prevent dishing from chemical mechanical polishing, where each dummy tile structure is not electrically connected via a top surface of the dummy tile structure to the predetermined supply voltage terminal.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device, comprising:
    providing a semiconductor substrate of a first conductivity type comprising a plurality of tiles that are spaced apart between active circuit areas;
    forming one or more isolation regions on the semiconductor substrate between the active circuit areas by performing chemical mechanical polishing on an insulating material using the plurality of tiles to promote planar chemical mechanical polishing of the insulating material between the active circuit areas;
    forming at a top surface of each of the plurality of tiles a corresponding plurality of well tie structures of the first conductivity type:
    forming a first metal interconnect structure in contact with a first plurality of well tie structures for electrically connecting a first plurality of tiles to a first predetermined supply voltage to provide latch-up protection; and
    forming a second metal interconnect structure in contact with a second plurality of well tie structures for electrically connecting a second plurality of tiles to a second predetermined supply voltage to provide latch-up protection,
    where the first plurality of tiles comprise N+ substrate regions located in close proximity to n-type emitter circuits.

2. The method of claim 1,
    where forming one or more isolation regions comprises:
    depositing an insulating material to cover the plurality of tiles and fill a plurality of shallow trench openings formed in the semiconductor substrate between the active circuit areas; and
    planarizing the insulating material by performing chemical mechanical polishing using the plurality of tiles to promote uniform polishing of the insulating material to form planar shallow trench isolation regions between the active circuit areas.

3. The method of claim 1,
    where forming the plurality of well tie structures comprises forming at a top surface of each of the plurality of well tie structures a silicide layer.

4. The method of claim 1,
    where forming the plurality of well tie structures comprises forming the second plurality of well tie structures as a plurality of heavily doped p-regions in a plurality of p-type tiles that are formed from the semiconductor substrate and have relatively lighter doping.

5. The method of claim 4, where forming the second metal interconnect structure comprises forming a metal interconnect structure in conductive contact with the plurality of heavily doped p-regions for electrically connecting the plurality of tiles to a ground supply voltage.

6. The method of claim 1,
    where forming the plurality of well tie structures comprises forming the first plurality of well tie structures as a plurality of heavily doped n-regions in a plurality of n-type tiles that are formed from the semiconductor substrate and have relatively lighter doping.

7. The method of claim 6, where forming the first metal interconnect structure comprises forming a metal interconnect structure in conductive contact with the plurality of heavily doped n-regions for electrically connecting the plurality of tiles to a power supply voltage.

8. A method for making a semiconductor device, comprising:
- providing a semiconductor substrate of a first conductivity type comprising a plurality of tiles that are spaced apart between active circuit areas;
- forming one or more isolation regions on the semiconductor substrate between the active circuit areas by performing chemical mechanical polishing on an insulating material using the plurality of tiles to promote planar chemical mechanical polishing of the insulating material between the active circuit areas;
- forming at a to surface of each of the plurality of tiles a corresponding plurality of well tie structures of the first conductivity type;
- forming a first metal interconnect structure in contact with a first plurality of well tie structures for electrically connecting a first plurality of tiles to a first predetermined supply voltage to provide latch-up protection; and
- forming a second metal interconnect structure in contact with a second plurality of well tie structures for electrically connecting a second plurality of tiles to a second predetermined supply voltage to provide latch-up protection,
- where the second plurality of tiles comprise P+ substrate regions located in close proximity to p-type emitter circuits.

9. The method of claim 8,
where forming one or more isolation regions comprises:
depositing an insulating material to cover the plurality of tiles and fill a plurality of shallow trench openings formed in the semiconductor substrate between the active circuit areas; and
planarizing the insulating material by performing chemical mechanical polishing using the plurality of tiles to promote uniform polishing of the insulating material to form planar shallow trench isolation regions between the active circuit areas.

10. The method of claim 8,
where forming the plurality of well tie structures comprises
forming at a top surface of each of the plurality of well tie structures a silicide layer.

11. The method of claim 8,
where forming the plurality of well tie structures comprises
forming the second plurality of well tie structures as a plurality of heavily doped p-regions in a plurality of p-type tiles that are formed from the semiconductor substrate and have relatively lighter doping.

12. The method of claim 11,
where forming the second metal interconnect structures comprises
forming a metal interconnect structure in conductive contact with the plurality of heavily doped p-regions for electrically connecting the plurality of tiles to a ground supply voltage.

13. The method of claim 8,
where forming the plurality of well tie structures comprises
forming the first plurality of well tie structures as a plurality of heavily doped n-regions in a plurality of n-type tiles that are formed from the semiconductor substrate and have relatively lighter doping.

14. The method of claim 13,
where forming the first metal interconnect structures comprises
forming a metal interconnect structure in conductive contact with the plurality of heavily doped n-regions for electrically connecting the plurality of tiles to a power supply voltage.

* * * * *